(12) United States Patent
Axholt (10) Patent No.: US 9,281,851 B2
(45) Date of Patent: Mar. 8, 2016

(54) POWER AMPLIFIER PRE-DISTORTION SIGNAL GENERATOR USING AN ANALOG BASEBAND ENVELOPE FEEDBACK LOOP

(71) Applicant: Telefonaktiebolaget L M Ericsson (publ), Stockholm (SE)

(72) Inventor: Andreas Axholt, Lund (SE)

(73) Assignee: TELEFONAKTIEBOLAGET L M ERICSSON (PUBL), Stockholm (SE)

( * ) Notice: Subject to any disclaimer, the term of this patent is extended or adjusted under 35 U.S.C. 154(b) by 18 days.

(21) Appl. No.: 14/306,720

(22) Filed: Jun. 17, 2014

(65) Prior Publication Data
US 2015/0365114 A1    Dec. 17, 2015

(51) Int. Cl.
*H04B 1/04* (2006.01)

(52) U.S. Cl.
CPC ...... *H04B 1/0475* (2013.01); *H04B 2001/0425* (2013.01); *H04B 2001/0433* (2013.01)

(58) Field of Classification Search
CPC .......... H04B 1/02; H04B 1/04; H04B 1/0475; H04B 1/16; H04B 1/40; H04B 17/10; H04B 17/11; H04B 17/13; H04B 17/21; H04B 17/0085; H04B 2001/0408; H04B 2001/0425; H04B 2001/0441; H03F 1/0222; H03F 1/025; H03F 1/3241; H03F 2200/78; H03F 2200/451; H03F 2201/3227; H03F 2203/45112

USPC .......... 455/114.2, 114.3, 115.1, 115.2, 115.3, 455/127.1, 127.2, 127.3; 375/296, 297
See application file for complete search history.

(56) References Cited

U.S. PATENT DOCUMENTS

| | | | | |
|---|---|---|---|---|
| 7,620,373 | B2 * | 11/2009 | Cole | H04B 17/14 375/296 |
| 7,778,345 | B2 * | 8/2010 | Sperlich | H03F 1/3247 375/296 |
| 8,154,432 | B2 * | 4/2012 | Kaper | H03M 1/1052 330/149 |
| 8,912,851 | B2 * | 12/2014 | Pinarello | H03F 1/0272 330/296 |
| 9,065,537 | B2 * | 6/2015 | Georgantas | H04B 1/30 |
| 2003/0045238 | A1 | 3/2003 | Leizerovich et al. | |
| 2009/0256630 | A1 | 10/2009 | Brobston | |
| 2012/0169424 | A1 | 7/2012 | Pinarello et al. | |
| 2015/0155835 | A1 * | 6/2015 | Al-Qaq | H03F 1/3241 375/296 |

OTHER PUBLICATIONS

International Search Report issued in corresponding International application No. PCT/EP2015/063288, date of completion of the International search Aug. 13, 2015.

* cited by examiner

*Primary Examiner* — Quochien B Vuong
(74) *Attorney, Agent, or Firm* — Patent Portfolio Builders PLLC (57) ABSTRACT

Presented are methods and apparatuses for maintaining a substantially constant gain and reducing gain compression (AM-AM distortion) of a power amplifier based on a pre-distortion signal generated from an analog, baseband envelope feedback loop.

14 Claims, 6 Drawing Sheets

POWER AMPLIFIER PRE-DISTORTION SIGNAL GENERATOR USING AN ANALOG BASEBAND ENVELOPE FEEDBACK LOOP

TECHNICAL FIELD

The present invention generally relates to reducing the current consumption of transmitter power amplifiers and more particularly, to mechanisms and techniques for pre-distorting the power amplifier input to improve linearity and efficiency.

BACKGROUND

In modern transmitters the power amplifier (PA) is one of the dominating current consumers and reducing current consumption is of ongoing concern to transmitter design. Attempts to reduce the current consumption of the PA, i.e., increase the efficiency of the PA, can be based on biasing the PA with as low a quiescent current as possible. However, increasing the efficiency of the PA comes at the cost of a loss of linearity of the PA. Generally speaking the linearity of the PA is inversely proportional to the efficiency of the PA, the higher linearity the lower power efficiency. Considering the higher bitrates and more complex modulation schemes associated with today's transmissions, the linearity requirements are increased and therefore the power consumption is increased.

To achieve good linearity combined with good efficiency, a technique known as digital pre-distortion can be applied. Once the behavior of the PA is known the input of the PA can be pre-distorted with the "inverse" of the expected error. The theory is that the desired signal plus the "inverse" of the distortion should generate only the wanted signal after the PA.

The digital pre-distortion technique assumes that the characteristics of the PA are well understood, i.e., both over process, voltage, and temperature (PVT), however, this knowledge is not trivial to achieve due to the large number of combinations of PVT variations and any deviation in the behavior of the PA, from the expected behavior of the PA will result in a degradation of the linearity associated with the PA when digital pre-distortion is applied.

Accordingly, it would be desirable to provide devices, systems and methods for reducing the current consumption while maintaining linearity of power amplifiers in transmitter systems.

SUMMARY

These, and other, issues associated with power amplifier efficiency and biasing of power amplifiers are addressed by the embodiments described herein.

According to an embodiment, a system includes a baseband signal generator configured to generate a baseband signal, a mixer for upconverting the baseband signal to a radio signal, a power amplifier configured to amplify the radio signal; and a pre-distortion circuit configured to bias the power amplifier and including: an envelope extractor for extracting an envelope of the baseband signal; a first attenuator coupled to an output of the envelope extractor; a first power amplifier unit cell coupled to an output of the first attenuator; a second power amplifier unit cell coupled to an output of the envelope extractor; a second attenuator coupled to an output of the second power amplifier unit cell; a comparator block coupled to the first power amplifier unit cell and to the second attenuator for generating an error signal associated with a difference between an output of the first power amplifier unit cell and an output of the second attenuator; and a biasing element coupled to an output of the comparator block which biases the power amplifier using the error signal.

According to another embodiment, a method includes the steps of: generating a baseband signal, upconverting the baseband signal to a radio signal, amplifying the radio signal using a power amplifier; and biasing the power amplifier by: extracting an envelope of the baseband signal, providing the envelope of the baseband signal to a first attenuator and a first power amplifier unit cell coupled to an output of the first attenuator, providing the envelope of the baseband signal to a second power amplifier unit cell and to a second attenuator coupled to an output of the second power amplifier unit cell, generating an error signal associated with a difference between an output of the first power amplifier unit cell and an output of the second attenuator; and biasing the power amplifier using the error signal.

According to another embodiment, a system includes a baseband signal generator configured to generate a baseband signal, a mixer for upconverting the baseband signal to a radio signal, a power amplifier configured to amplify the radio signal; and a pre-distortion circuit connected to the baseband signal generator and the power amplifier, and operable in a pre-distortion mode and a calibration mode, wherein the pre-distortion circuit is configured in the pre-distortion mode to bias the power amplifier by evaluating an envelope of the baseband signal to generate an error signal which is added to a nominal bias voltage used to bias the power amplifier, and wherein the pre-distortion circuit is configured in the calibration mode to adjust the error signal to account for one or more mismatches in the pre-distortion circuit.

According to another embodiment, a method includes the steps of generating a baseband signal, upconverting the baseband signal to a radio signal, amplifying the radio signal; and operating in a pre-distortion mode to bias an amplifier used to amplify the radio signal by evaluating an envelope of the baseband signal to generate an error signal which is added to a nominal bias voltage used to bias the amplifier, and operating in a calibration mode to adjust the error signal to account for one or more mismatches.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

The following description of the embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to the terminology and structure of power amplifier gain control for communication systems or devices. However, the embodiments to be discussed next are not limited to these systems but may be applied to other communication systems.

Reference throughout the specification to "one embodiment" or "an embodiment" means that a particular feature, structure, or characteristic described in connection with an embodiment is included in at least one embodiment of the present invention. Thus, the appearance of the phrases "in one embodiment" or "in an embodiment" in various places throughout the specification are not necessarily all referring to the same embodiment. Further, the particular features, structures or characteristics may be combined in any suitable manner in one or more embodiments.

Figure 1:
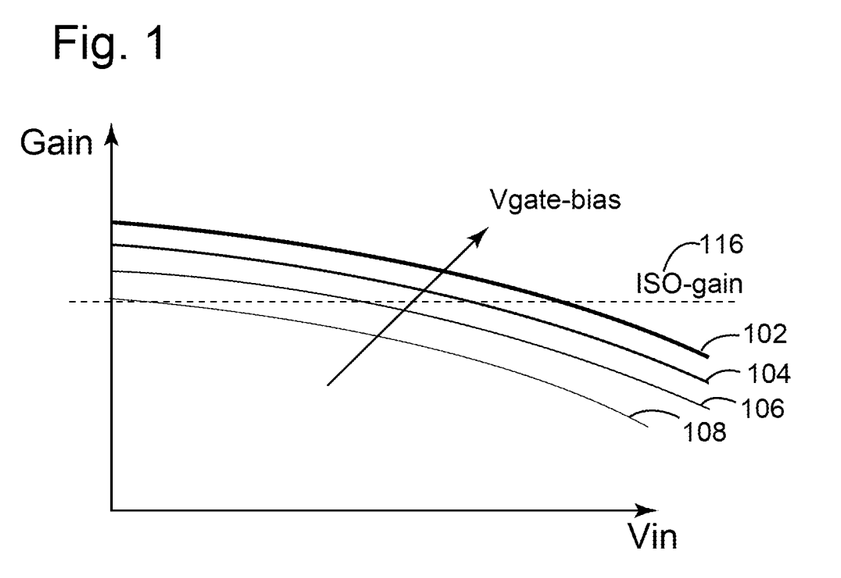
FIG. 1 is a graph depicting gain-compression versus gate-bias.

According to an embodiment, ensuring a constant gain for the power amplifier, i.e., reducing the gain compression/expansion, otherwise known as AM-AM distortion, involves dynamically changing the gate biasing of the power amplifier (PA) based on the envelope of operation of the power amplifier to maintain a substantially constant gain. This concept is illustrated in FIG. 1, wherein a representative series of gain-compression curves 102, 104, 106, and 108 is depicted as functions of their gain versus input voltage amplitude for different gate-bias conditions. From FIG. 1 it can be seen that by changing the gate-biasing of the power amplifier, the gain of the power amplifier can be maintained at a substantially constant level, e.g., that shown by ISO-gain level 116, which will result in lowering the distortion associated with the gain-compression.

With the concept in mind, various embodiments will now be described to implement variable gate biasing of PAs. Looking now to FIG. 2 and an embodiment 200 of a power amplifier pre-distortion signal generator, two unit cells 202, 204 are used to mimic operation of a power amplifier (not shown in FIG. 2, see FIGS. 3 and 4 discussed below). As will be appreciated by those skilled in the art, a unit cell typically consists of one or more transistors coupled together in series, e.g., two transistors connected source to drain to one another, or a number of such arrangements coupled together, such that the unit cell(s) function to amplify signals which are input thereto. A number of unit cells can be used together to form a power amplifier.

Figure 2:
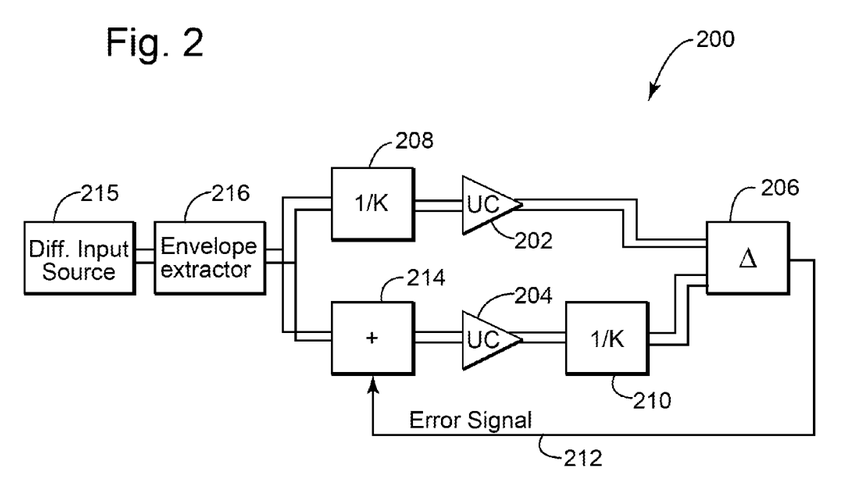
FIG. 2 is a schematic diagram depicting an analog pre-distortion signal generator according to an embodiment.

It should be noted in the embodiment that the unit cells 202, 204 share the same differential input source 215 and that, therefore, the envelope of the signal extracted by unit 216 is represented with differential signals (two signal lines). The embodiment depicts that one branch has an attenuator or scaling element 208 disposed in front of the unit cell 202 while the other branch has an attenuator or scaling element 210 disposed after the unit cell 204. With this arrangement, if the unit cells 202 and 204 have identical gain then the output of the delta block or comparator 206 would be zero. However, due to the effects of gain-compression, and because the input signal to unit cell 204 will be larger than the input signal to the unit cell 202 (i.e., since there is no attenuator upstream of unit cell 204), there will be a difference between the two unit cell outputs and the output of delta block 206 will be non-zero as the inputs to the power amplifier vary in amplitude.

The information in the output of the delta-block 206 of the embodiment 200 is thus used to correct for the gain-compression by feeding the error signal 212 back as part of the input to the unit cell 204 via summer 214. Based on the feedback, the loop attempts to minimize the difference between the two differential inputs of the comparator 206 and thereby maintain the gain as a constant value.

More specifically, envelope compression in the input signal is detected by feeding the second unit cell 204 with the real envelope signal and then scaling its output by 1/K and comparing this scaled output to the output of the first unit cell 202 which sees a scaled input instead. If both unit cells 202 and 204 are linear, then the gain G of unit cell 202*(1/K) and the scaled gain (1/K)*the gain G of unit cell 204 will be the same. However, when one of the gains G of the unit cells 202, 204 compresses, then the first term will be (G−dG)*(1/K) (where dG is the change in gain due to compression) and the other term will still be (1/K)*G (as the scaled input in the latter case is too small to cause compression). Forming the difference (at baseband), the envelope compression becomes easy to detect and a bias compensation can be derived (i.e., error signal 212).

Figure 3:
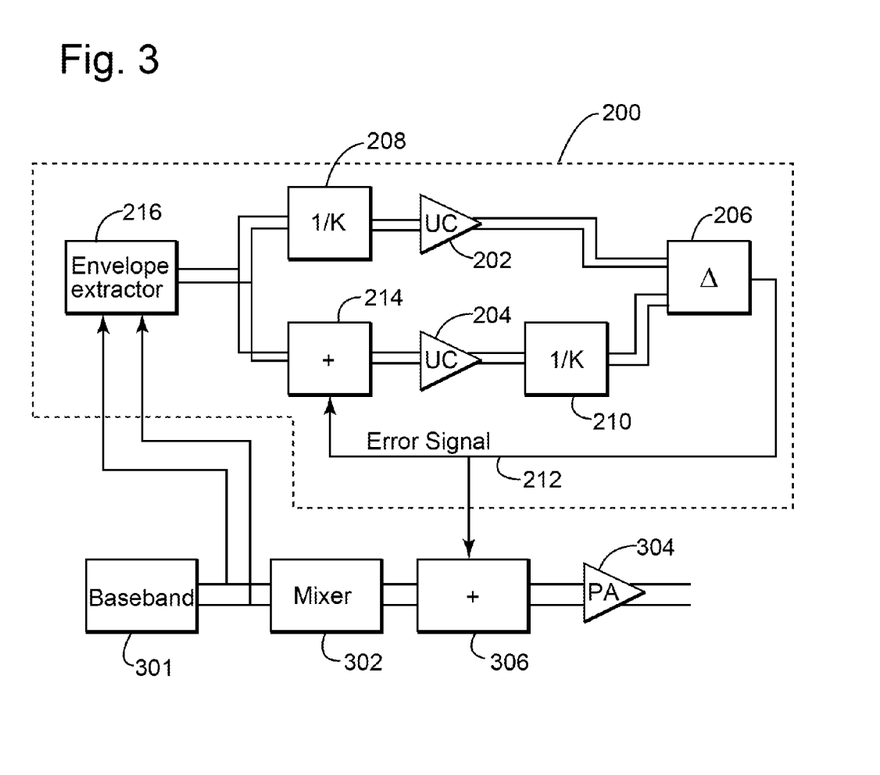
FIG. 3 is a schematic diagram depicting an analog pre-distortion signal generator with an up-converter and a power amplifier according to an embodiment.

While FIG. 2 shows the general operation of a power amplifier pre-distortion signal generator according to an embodiment, other embodiments are contemplated which relate to various implementations thereof. For example, one use of circuit 200 is in connection with a transmit chain of elements as can be seen in FIG. 3, which depicts an embodiment that combines the analog pre-distortion signal generator 200 described above with a transmit chain including a baseband signal generator 300, mixer 302, and power amplifier 304. As will be appreciated by those skilled in the art, baseband signal generator 300 outputs a data modulated signal at a baseband frequency, which is then upconverted by mixer 302 to a radio frequency (RF) for amplification by power amplifier 304 prior to being coupled to one or more antennas for transmission over an air interface. Summer 306 adds the variable bias voltage which biases the power amplifier 304 to maintain its gain at a constant (or substantially constant) level. Of particular interest in FIG. 3, note that the inputs to the pre-distortion circuit 200 are baseband signals, and particularly differential baseband signals.

Additionally, note that the unit cells 202, 204 used in the construction of the pre-distortion signal generator 200 and the power amplifier 304 are substantially identical, such that the gain compression of the power amplifier 304 is reduced based the provision of the error signal to the upconverted signal output from mixer 302 via block 306. Assuming in the embodiments that the gain-compression, i.e., AM-AM distortion, versus frequency behavior does not substantially change between baseband and RF, the power amplifier 304 will have the same gain-compression as the baseband unit cells 202, 204 used to generate the error signal and therefore the error signal can be fed to the power amplifier 304 to compensate for the gain-compression of the radio frequency power amplifier 304.

Although a large loop gain is beneficial in the pre-distortion compensation loop 200 for accurately tracking the envelope and for generating a correct adaptive error signal for the power amplifier 304, and therefore the delta or comparator block may be designed with a gain factor of, e.g., 100 or 1000, an error at the input of the delta-block 206 which cannot be corrected by the feedback to block 214 will cause an offset proportional to that loop gain. For example, an output current mismatch between the positive and negative differential signals output from a unit cell 202, 204 will be amplified by the delta-or comparator block 206 and, if the mismatch is large enough, combined with the high gain in the delta block 206, the output of the delta-block 206 can saturate and cause the pre-distortion loop 200 to malfunction.

Figure 4:
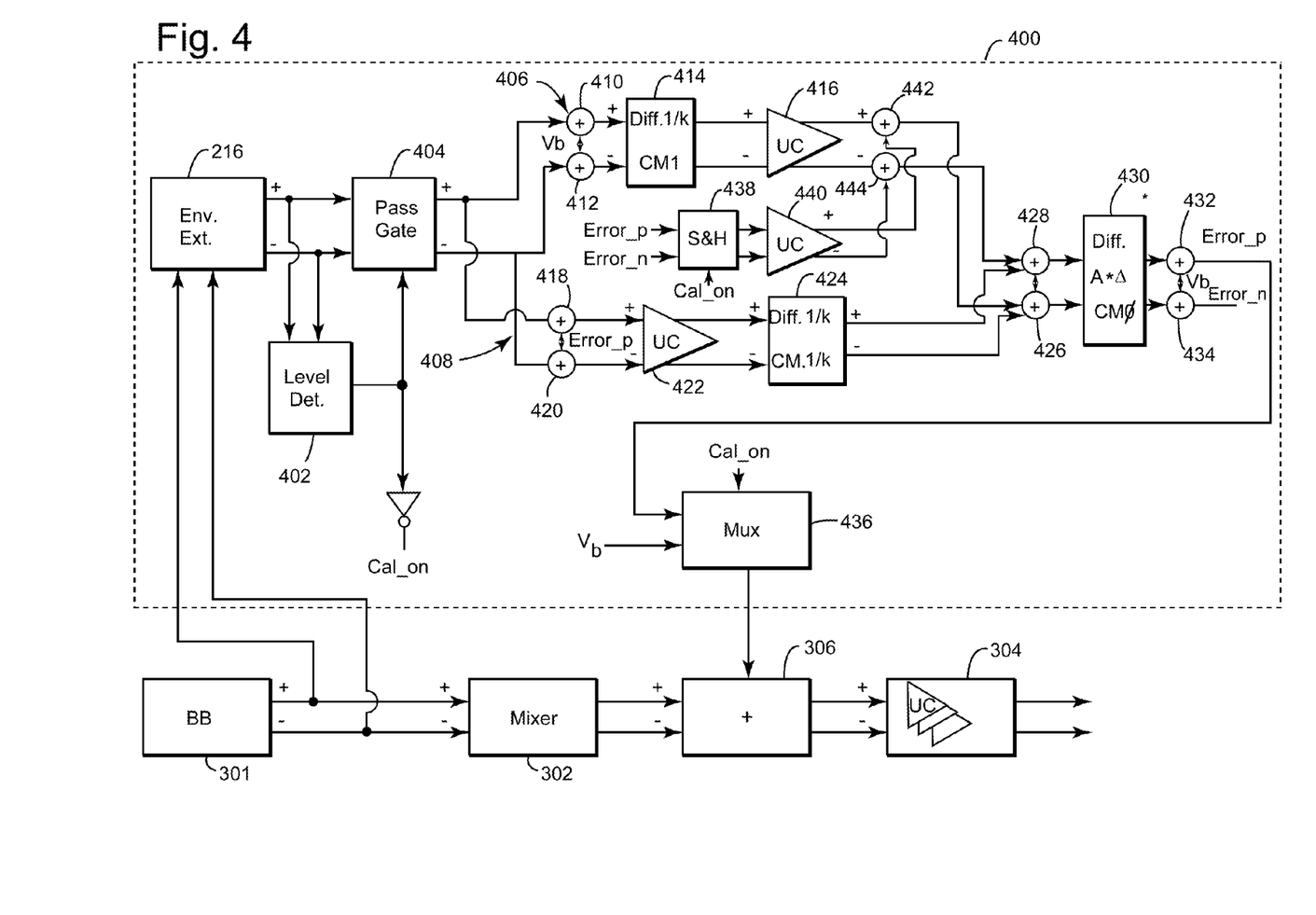
FIG. 4 is a diagram depicting an analog pre-distortion signal generator, an up-converter with a power amplifier and a calibration loop according to an embodiment.

This potential problem can be addressed, and now looking to FIG. 4 and another embodiment of a power amplifier pre-distortion circuit 400, by adding a calibration loop to prevent the malfunction of the pre-distortion loop associated with an output current mismatch. Therein, the baseband processing element 301, mixer 302, adder 306 and power amplifier 304 operate as previously described.

Starting then with the envelope extractor 216, this element receives the differential baseband signals as inputs and evaluates the absolute value of the differential signals to determine the envelope of the baseband signal. When the baseband signal envelope's amplitude is small, then the gain-compression of the power amplifier 304, i.e., the AM-AM distortion, varies less than when the signal amplitudes are greater. Accordingly, the bias or error signal from the pre-distortion loop 200 to the power amplifier 304 will be close to the nominal bias voltage Vb when the baseband signal amplitudes are low, and the pre-distortion adjustment will not be needed as much. This presents an opportunity to calibrate the circuit to address the effects of output current mismatch mentioned above. Thus, according to an embodiment, during intervals when the baseband signal envelope amplitude is below a predefined level, e.g., less than 50 mV, the pre-distortion (differential) loop is turned off and a calibration (common mode) loop is activated. Those skilled in the art will appreciate that the predefined level used to switch between the pre-distortion loop and the calibration loop represents a trade-off between frequency of calibration of the circuit versus the amount of time that pre-distortion is afforded to the power amplifier and may vary from implementation to implementation.

The selection of a mode of operation, i.e., either pre-distortion or calibration, is controlled by level detector 402 in the circuit 400. If the baseband signal envelope's amplitude is higher than the pre-defined level, then the level detector 402 outputs a control signal which enables the pass gate 404 to pass the baseband signal envelope on to the rest of the circuit and which disables the calibration control signal Cal_on, such that the circuit operates in its pre-distortion mode. Alternatively, if the baseband signal envelope's amplitude is lower than the pre-defined level, then the level detector 402 outputs a control signal which disables the pass gate 404, i.e., placing it into a high impedance state wherein it does not pass the baseband signal envelope, and which enables the calibration control signal Cal_on, such that the circuit 400 operates in its calibration mode. The operation of the circuit 400 in each of these modes will now be discussed.

Starting with the pre-distortion mode of operation (in which differential signals are relevant rather than common mode signals), as mentioned above in this mode of operation, pass gate 400 passes the baseband signal envelope on to the upper 404 and lower 406 branches of the circuit. In the upper branch, the nominal (and lowest) bias value Vb is added (as a common mode signal) to both differential signals associated with the baseband signal envelope at adders 410 and 412. The summed Vb plus differential envelope signal is then input to a scaling circuit element 414 which operates to scale the differential part of the input (Diff.) by a factor of 1/K, without scaling the common mode portion of the input (i.e., CM scaling=1). The scaled envelope plus Vb differential outputs from circuit element 414 are input to the unit cell 416 which amplifies those inputs and outputs the amplified differential signals to adders 426 and 428 which will be discussed in more detail below.

Picking up the discussion next with the lower branch 408 of circuit 400, each of the differential baseband envelope signals from the pass gate 404 are added to common mode error signal error_p at adders 418 and 420. The manner in which common mode error signal error_p is generated is discussed below. The differential baseband envelope signals plus error_p are input to unit cell 422 and amplified by the unit cell 422. The amplified differential signals output from unit cell 422 are input to scaling element 424, where both the differential part and the common mode part of the inputs are scaled by a factor of 1/K. The resulting, scaled outputs are passed on to adders 426 and 428.

Adders 426 and 428 operate to subtract the differential outputs from the two branches 406 and 408 from one another. More specifically, the positive differential output from unit cell 416 is added to the negative differential output from scaling element 424 in adder 426, and the negative differential output from unit cell 416 is added to the positive differential output from scaling element 424 in adder 428. Ideally, i.e., if the unit cells 416 and 422 are not affected by gain compression, then the outputs of both adders 426 and 428 would be zero.

However when gain compression is affecting the input baseband signal, then the outputs of adders 426 and 428 will be non-zero. In this latter case, the delta or comparator block 430 determines the difference ($\Delta$) between its inputs and outputs a differential signal which is the difference times a loop gain factor A (i.e., for differential signals block 430 outputs $A*\Delta$). The signals output from the comparator block 430 have Vb added thereto at adders 432 and 434 (as a common mode signal), the result of which are error signals error_p and error_n, respectively (which error signals have the same amplitude, but different signs/polarity). During its operation in pre-distortion mode, circuit 400 supplies the error signal error_p (i.e., $Vb+A*\Delta$) to multiplexor 436, which is passed on as the selected output to summer 306 as the bias voltage for power amplifier 304 and also supplies this error signal to the lower branch 408 as feedback which attempts to drive the inputs to block 430 back to zero. As also illustrated in FIG. 4, block 430 drives common mode signals to zero, which aspect becomes significant during calibration mode discussed below.

Alternatively, and now considering calibration mode operation of circuit 400, when the amplitude of the baseband signal's envelope is below the predefined threshold level, then the level detector 402 will output a control signal which disables pass gate 404 and turns on the calibration control signal Cal_on. Since the pass gate 404 does not provide a signal to the adders 410, 412, 418 and 420 in calibration mode, the inputs to scaling element 414 will both be Vb and the inputs to the unit cell 422 will both be error_p (which will be equal to Vb in calibration mode since there is now no differential signals being input to the upper and lower branches 406 and 408). With all four of these inputs equal to Vb, and absent the contributions of the sample and hold (S&H) element 438 and third unit cell 440 to be discussed below, the inputs to the comparator 430 should ideally be zero. However due to one or more of a plurality of mismatch issues (e.g., the unit cells 416 and 422 are not identical, the common mode or differential scaling of elements 414 and 424 are not precisely 1 or 1/K as indicated in the respective blocks, etc.), and despite all four outputs from adders 410, 412, 418 and 420 being held to Vb, the inputs to comparator 430 (absent the contributions from UC 440) are not zero.

This mismatch issue is addressed during calibration mode by elements 438, 440 and adders 442 and 444. When the calibration mode is entered, the Cal_on signal initiates a sampling sequence of the error_p and error_n signals by the sample and hold (S&H) circuit 438. Sampled values of are output from the S&H circuit 438 as differential inputs to a third unit cell 440, which amplifies these inputs and presents the amplified versions to adders 442 and 444, where they are added to the outputs of UC 416 to compensate for any mismatches introduced into the error signal error_p. Also, while the circuit 400 is in calibration mode, the Cal_on signal operates to select Vb as the output for multiplexor 436 to be provided as the bias voltage for adder 306. Effectively, elements 438, 440, 442 and 444 operate as a new feedback loop during calibration mode which tend to minimize the DC error between the inputs to the comparator block 430 based on changing the differential input to the third unit cell 440 and therefore compensate for, e.g., DC current errors associated with the other two unit cells 416, and 422.

Once the baseband signal envelope's amplitude climbs above the predefined threshold, the sample and hold circuit 438 maintains the voltage at the gate of the third unit cell 438. Accordingly, the circuit 400 returns to operating as a differential, pre-distortion mode loop and the bias signal to the power amplifier 304, i.e., the output of multiplexor 436, returns to being the output from the comparator block 206 (plus Vb) instead of the nominal bias voltage $V_b$.

According to another embodiment, it is possible to adjust a small, pre-characterized frequency compensation to error_signal_p to handle slight deviations versus frequency. Such a frequency compensation could be a multiplicative and/or additive factor that is frequency band dependent (i.e. semi-static). This frequency compensation factor can, for example, be provided in various locations in the circuit of FIG. 4, e.g., before or after the envelope extractor 216, into the lower MUX block 436 or between block 436 and the summing node 306 before the multiple-UCs in the PA 304 (i.e., such that the frequency compensation factor will only affect the error_signal_p-path leading to the PA 304 and not the error signal going to the envelope path via summer 214 (unless the frequency compensation factor is implemented as an inverse compensation in which case the reverse would be true).

In the foregoing embodiments, the error signal (error_p) is fed back into the loop as a common mode signal. However this mechanism for using the error signal is not a requirement, and the error signal can be introduced into the compensatory loop in other ways that will be apparent to those skilled in the art to achieve the desired bias voltage adjustment of the power amplifier.

Figure 5:
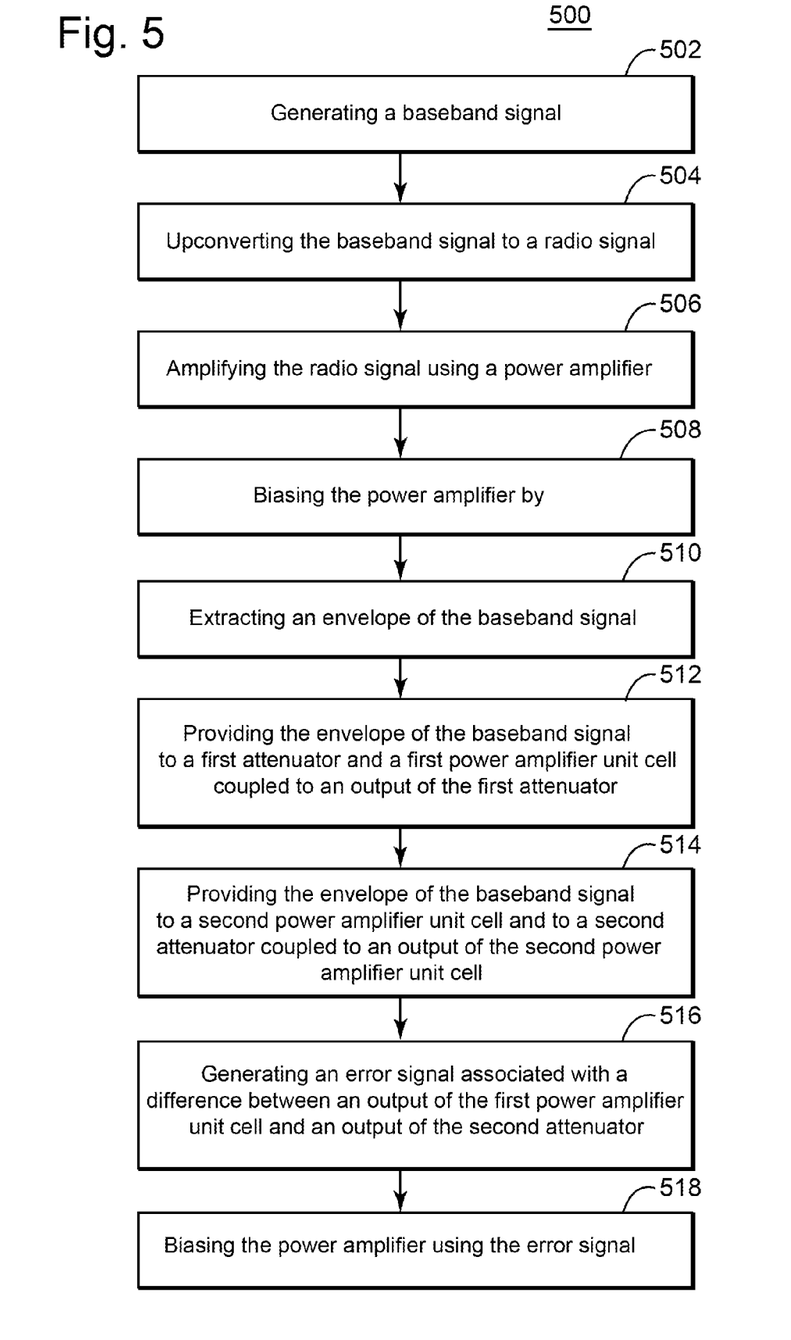
FIGS. 5 and 6 are flowcharts illustrating methods according to embodiments.
Figure 6:
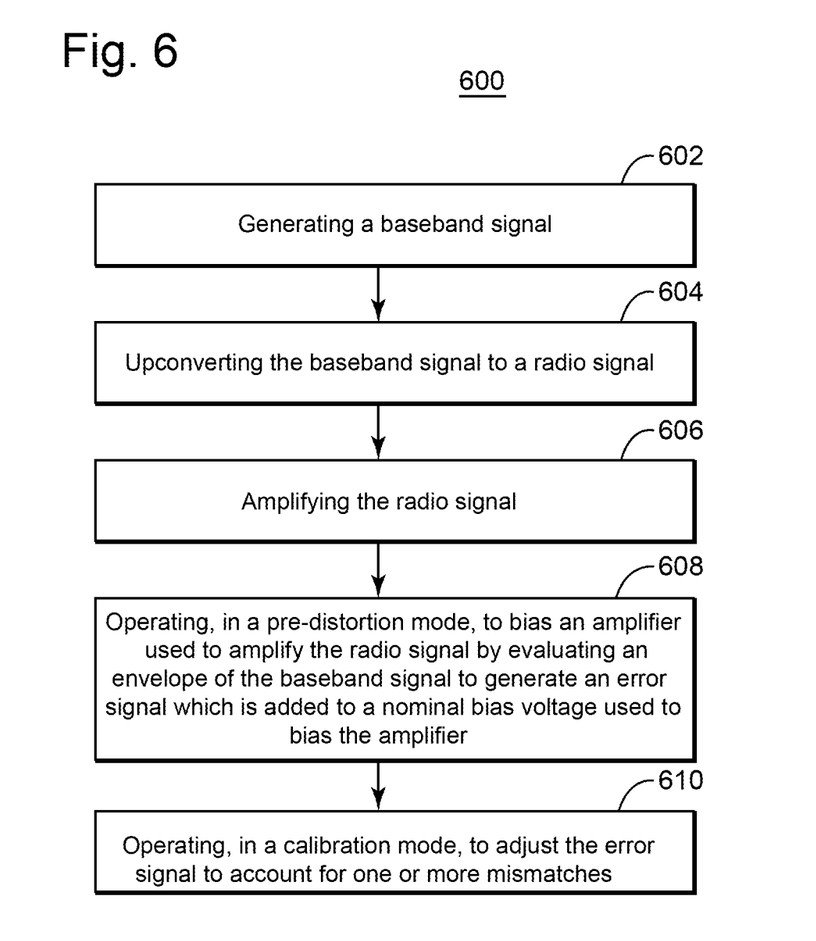

In addition, the embodiments can be expressed as methods, examples of which are illustrated in the flowcharts of FIGS. 5 and 6. In FIG. 5, a method 500 for biasing a power amplifier includes the steps of generating a baseband signal 500, upconverting the baseband signal to a radio signal 502, amplifying the radio signal using a power amplifier 504 and biasing the power amplifier 506. Biasing the power amplifier 506 includes the steps of extracting an envelope of the baseband signal 508, providing the envelope of the baseband signal to a first attenuator and a first power amplifier unit cell coupled to an output of the first attenuator 510, providing the envelope of the baseband signal to a second power amplifier unit cell and to a second attenuator coupled to an output of the second power amplifier unit cell 512, generating an error signal associated with a difference between an output of the first power amplifier unit cell and an output of the second attenuator 514 and biasing the power amplifier using the error signal 516.

According to another embodiment, a method 600 for biasing an amplifier is shown in FIG. 6. The method includes the steps of generating a baseband signal 602, upconverting the baseband signal to a radio signal 604, amplifying the radio signal; 606, operating, in a pre-distortion mode, to bias an amplifier used to amplify the radio signal by evaluating an envelope of the baseband signal to generate an error signal which is added to a nominal bias voltage used to bias the amplifier 608, and operating, in a calibration mode, to adjust the error signal to account for one or more mismatches 610.

The foregoing embodiments can be used in any type of transmitter or transceiver device. For example, those used in mobile terminals, smartphones and other wireless devices.

It should be understood that this detailed description is not intended to limit the invention. On the contrary, the embodiments are intended to cover alternatives, modifications and equivalents, which are included in the spirit and scope of the invention. Further, in the detailed description of the embodiments, numerous specific details are set forth in order to provide a comprehensive understanding of the invention. However, one skilled in the art would understand that various embodiments may be practiced without such specific details.

Although the features and elements of the embodiments are described in particular combinations, each feature or element can be used alone without the other features and elements of the embodiments or in various combinations with or without other features and elements disclosed herein. Thus, this written description uses examples of the subject matter disclosed to enable any person skilled in the art to practice the same, including making and using any devices or systems and performing any incorporated methods. The scope of the subject matter is defined by the claims, and may include other examples that occur to those skilled in the art. Such other examples are intended to be within the scope of the claims.

The invention claimed is:

1. A system comprising:
a baseband signal generator configured to generate a baseband signal;
a mixer for upconverting the baseband signal to a radio signal;
a power amplifier configured to amplify the radio signal; and
a pre-distortion circuit configured to bias the power amplifier and including:
an envelope extractor for extracting an envelope of the baseband signal;
a first attenuator coupled to an output of the envelope extractor;
a first power amplifier unit cell coupled to an output of the first attenuator;
a second power amplifier unit cell coupled to an output of the envelope extractor;
a second attenuator coupled to an output of the second power amplifier unit cell;
a comparator block coupled to the first power amplifier unit cell and to the second attenuator for generating an error signal associated with a difference between an output of the first power amplifier unit cell and an output of the second attenuator;
and a biasing element coupled to an output of the comparator block which biases the power amplifier using the error signal.

2. A method comprising:
generating a baseband signal;
upconverting the baseband signal to a radio signal;
amplifying the radio signal using a power amplifier; and
biasing the power amplifier by:
extracting an envelope of the baseband signal;
providing the envelope of the baseband signal to a first attenuator and a first power amplifier unit cell coupled to an output of the first attenuator;
providing the envelope of the baseband signal to a second power amplifier unit cell and to a second attenuator coupled to an output of the second power amplifier unit cell;

generating an error signal associated with a difference between an output of the first power amplifier unit cell and an output of the second attenuator; and biasing the power amplifier using the error signal.

3. A system comprising:

a baseband signal generator configured to generate a baseband signal;

a mixer for upconverting the baseband signal to a radio signal;

a power amplifier configured to amplify the radio signal;

a pre-distortion circuit connected to the baseband signal generator and the power amplifier, and operable in a pre-distortion mode and a calibration mode, wherein the pre-distortion circuit is configured in the pre-distortion mode to bias the power amplifier by evaluating an envelope of the baseband signal to generate an error signal which is added to a nominal bias voltage used to bias the power amplifier, and wherein the pre-distortion circuit is configured in the calibration mode to adjust the error signal to account for one or more mismatches in the pre-distortion circuit; and a level detector configured to compare an amplitude of the envelope of the baseband signal with a predetermined threshold and to place said pre-distortion circuit into either the pre-distortion mode or the calibration mode based on a result of the comparison.

4. The system of claim 3, wherein the pre-distortion circuit comprises:

an envelope extractor for extracting the envelope of the baseband signal;

a first attenuator coupled to an output of the envelope extractor;

a first power amplifier unit cell coupled to an output of the first attenuator;

a second power amplifier unit cell coupled to an output of the envelope extractor;

a second attenuator coupled to an output of the second power amplifier unit cell;

a comparator block coupled to the first power amplifier unit cell and to the second attenuator for generating the error signal based on a difference between an output of the first power amplifier unit cell and an output of the second attenuator; and a biasing element coupled to an output of the comparator block which biases the power amplifier using the error signal.

5. The system of claim 4, further comprising:

a pass gate, connected to the envelope extractor and the level detector, configured to pass the envelope of the baseband signal to the first attenuator and to the second power amplifier unit cell when the system is in the pre-distortion mode.

6. The system of claim 4, further comprising:

a third power amplifier unit cell which receives the error signal as inputs when the system is in the calibration mode.

7. The system of claim 6, wherein outputs of the third power amplifier unit cell are added to outputs of the first power amplifier unit cell when the system is in the calibration mode.

8. The system of claim 3, further comprising:

a multiplexor which selects the error signal plus the nominal bias voltage for output to bias the power amplifier when the system is in the pre-distortion mode and which selects the nominal bias voltage for output to bias the power amplifier when the system is in the calibration mode.

9. A method comprising:

generating a baseband signal;

upconverting the baseband signal to a radio signal;

amplifying the radio signal; and operating in a pre-distortion mode to bias an amplifier used to amplify the radio signal by evaluating an envelope of the baseband signal to generate an error signal which is added to a nominal bias voltage used to bias the amplifier, operating in a calibration mode to adjust the error signal to account for one or more mismatches; and comparing an amplitude of the envelope of the baseband signal with a predetermined threshold and entering into either the pre-distortion mode or the calibration mode based on a result of the comparison.

10. The method of claim 9, further comprising:

extracting the envelope of the baseband signal;

providing the envelope of the baseband signal to a first attenuator having its output coupled to a first power amplifier unit cell;

providing the envelope of the baseband signal to a second power amplifier unit cell having its output coupled to a second attenuator;

comparing an output of the first power amplifier unit cell to an output of the second attenuator;

generating the error signal based on a result of the comparing step; and biasing the amplifier using the error signal when operating in the pre-distortion mode.

11. The method of claim 10, further comprising:

passing the envelope of the baseband signal to the first attenuator and to the second power amplifier unit cell only when operating in the pre-distortion mode.

12. The method of claim 10, further comprising:

receiving, by a third power amplifier unit cell, the error signal as input when operating in the calibration mode.

13. The method of claim 12, further comprising:

adding outputs of the third power amplifier unit cell to outputs of the first power amplifier unit cell when operating in the calibration mode.

14. The method of claim 9, further comprising:

selecting the error signal plus the nominal bias voltage to bias the power amplifier when operating in the pre-distortion mode; and selecting the nominal bias voltage for output to bias the power amplifier when operating in the calibration mode.

* * * * *

UNITED STATES PATENT AND TRADEMARK OFFICE
CERTIFICATE OF CORRECTION

| | | |
|---|---|---|
| PATENT NO. | : 9,281,851 B2 | Page 1 of 1 |
| APPLICATION NO. | : 14/306720 | |
| DATED | : March 8, 2016 | |
| INVENTOR(S) | : Axholt | |

It is certified that error appears in the above-identified patent and that said Letters Patent is hereby corrected as shown below:

On the Title Page, in item (74), under "Attorney, Agent, or Firm", in Column 2, Lines 1-2, delete "Builders PLLC" and insert -- Builders, PLLC --, therefor.

In the Specification

In Column 5, Line 47, delete "pass gate 400" and insert -- pass gate 404 --, therefor.

In Column 5, Line 48, delete "upper 404 and lower 406" and insert -- upper 406 and lower 408 --, therefor.

In Column 7, Line 44, delete "signal 500," and insert -- signal 502, --, therefor.

In Column 7, Line 45, delete "radio signal 502," and insert -- radio signal 504, --, therefor.

In Column 7, Line 46, delete "amplifier 504" and insert -- amplifier 506 --, therefor.

In Column 7, Line 47, delete "amplifier 506. Biasing the power amplifier 506" and insert -- amplifier 508. Biasing the power amplifier 508 --, therefor.

In Column 7, Lines 48-49, delete "baseband signal 508," and insert -- baseband signal 510, --, therefor.

In Column 7, Line 51, delete "attenuator 510," and insert -- attenuator 512, --, therefor.

In Column 7, Line 54, delete "unit cell 512," and insert -- unit cell 514, --, therefor.

In Column 7, Line 56, delete "attenuator 514" and insert -- attenuator 516 --, therefor.

In Column 7, Line 57, delete "error signal 516." and insert -- error signal 518. --, therefor.

Signed and Sealed this
Twenty-eighth Day of June, 2016

Michelle K. Lee
*Director of the United States Patent and Trademark Office*